United States Patent [19]

Droguet et al.

[11] Patent Number: 4,567,643
[45] Date of Patent: Feb. 4, 1986

[54] METHOD OF REPLACING AN ELECTRONIC COMPONENT CONNECTED TO CONDUCTING TRACKS ON A SUPPORT SUBSTRATE

[75] Inventors: Jean-Paul Droguet, Courbevoie; Michel Vernay, Paris; Gérard Teissier, Asnières, all of France

[73] Assignee: Sintra-Alcatel, Asnières, France

[21] Appl. No.: 691,302

[22] PCT Filed: Oct. 24, 1983

[86] PCT No.: PCT/FR83/00214
§ 371 Date: Dec. 3, 1984
§ 102(e) Date: Dec. 3, 1984

[87] PCT Pub. No.: WO85/02060
PCT Pub. Date: May 9, 1985

[51] Int. Cl.[4] .................. H01L 21/60; H01L 21/58; H05K 3/32; H05K 13/04
[52] U.S. Cl. .......................... 29/575; 29/589; 29/847; 357/80
[58] Field of Search ............ 29/575, 577 C, 589, 29/590, 591, 847, 850, 831, 835; 357/80, 81

[56] References Cited

U.S. PATENT DOCUMENTS 3,969,813  7/1976  Minetti et al. ............ 29/575
4,012,832  5/1977  Crane ....................... 29/575

FOREIGN PATENT DOCUMENTS 2534440  4/1984  France ..................... 29/575
0117969  10/1978  Japan ...................... 29/575
0094753  7/1981  Japan ...................... 29/575

OTHER PUBLICATIONS

Anderson et al. "Josephson Package Repair", IBM Tech. Disc. Bull., vol. 26, No. 12, May 1984, pp. 6244-6245.
Patent Abstracts of Japan, vol. 5, No. 167, p. E-79-839 Published Oct. 24, 1981.
IBM Technical Disclosure Bulletin, vol. 24, No. 12, May 1982, p. 6371, M. L. Buller et al., "Back-To-Back Chip Pack".

Primary Examiner—Brian E. Hearn
Assistant Examiner—David A. Hey
Attorney, Agent, or Firm—Sughrue, Mion, Zinn, Macpeak and Seas

[57] ABSTRACT

The subject matter of the invention is a method of substituting an electronic component (A1) for an analogous component (1) connected to the conductive tracks (3) of a support substrate (2) by connection wires (4). The conductive tracks are cut beyond, relative to the component (1) to be taken out of service, the zones where the connection wires (4) are connected to the tracks, then the replacement component (A1) is placed on the upper glued face of the component (1), and is connected to the tracks by connection wires (4A) independent from the preceding wires.

This invention is particularly applicable to integrated circuits and to vacuum-deposited resistive thin film circuits.

2 Claims, 3 Drawing Figures

METHOD OF REPLACING AN ELECTRONIC COMPONENT CONNECTED TO CONDUCTING TRACKS ON A SUPPORT SUBSTRATE

The present invention relates to a method of replacing an electronic component connected to conducting tracks of a supporting substrate and is applicable more specifically to components of the chip type mounted on circuits manufactured by hybrid technology.

In this technology, electronic components are applied to a supporting substrate which is covered in conducting tracks and connections are made between the connection points of the components and the conducting tracks by means of wires made, for example, of gold or aluminium, which are welded by thermo-compression or by means of ultrasound.

The replacement of a component by another on a substrate is an operation which may be necessary for different reasons, the most common of which is the repair of a circuit which is faulty due to bad functioning of a component.

In view of the small size of the components and of the conducting tracks which serve them, the replacement of a component by another is an operation which is very difficult to perform, in particular because it usually requires the faulty component to be disconnected and removed from the substrate.

It is necessary to remove the connecting wires from the faulty component at substrate level without damaging the substrate and without breaking the wires into several pieces, the wires being in general less than 100 microns and more specifically 25 microns in diameter so that microscopic pieces thereof would create short-circuits in other points of the circuit. Moreover the conductive tracks should not be damaged because this could either interrupt electrical continuity or else prevent adherence of the repair connections.

Removing a faulty component is equally very difficult. The polymerized glue which is generally used yields with difficulty. When trying to remove the component, the substrate may be ruptured making any repair impossible, or the component may break, leaving pieces still adhering which have to be eliminated one by one; in any case, even if the glue yields easily, the state of the surface to be used for re-glueing is of poor quality. As regards the possibility of heating the defective component, although this is very efficient, it causes thermal stress and risks of loosening of nearby components, thus weakening the circuit in an unacceptable manner.

A method which is sometimes used consists in leaving the defective component in place and applying a new component thereon, after removing the initial connections one by one.

Up to now, this method could only be used if the component had a small number of interconnecting wires (not more than about 10, for example) because otherwise the risk would be too great and the time for carrying out the operation too lengthy for this method to be worth using. This method is in any case not practicable when the body of the component, as is the case in many instances, must be connected to a potential by means of a bonding area because in this case there would be no more contact between the back face of the component with the bonding area.

The present invention thus proposes a method of replacing an electronic component which is electrically connected to conducting tracks of a substrate by means of conducting wires, which method overcomes the above-listed drawbacks.

According to a characteristic of the invention the method of replacing the component comprises the following steps:

cutting by laser the conducting tracks beyond, relative to the component to be taken out of service, the zones where the connecting wires are attached to the tracks, applying a glue to the upper surface of the component to be taken out of service, placing a replacement component on the component to be taken out of service, causing the glue to set by heating, interconnecting the replacement component with the conducting tracks beyond the cuts.

The characteristics and advantages of the invention will be more accurately shown in the course of the following description with reference to the figures given herein below.

Figure 1:
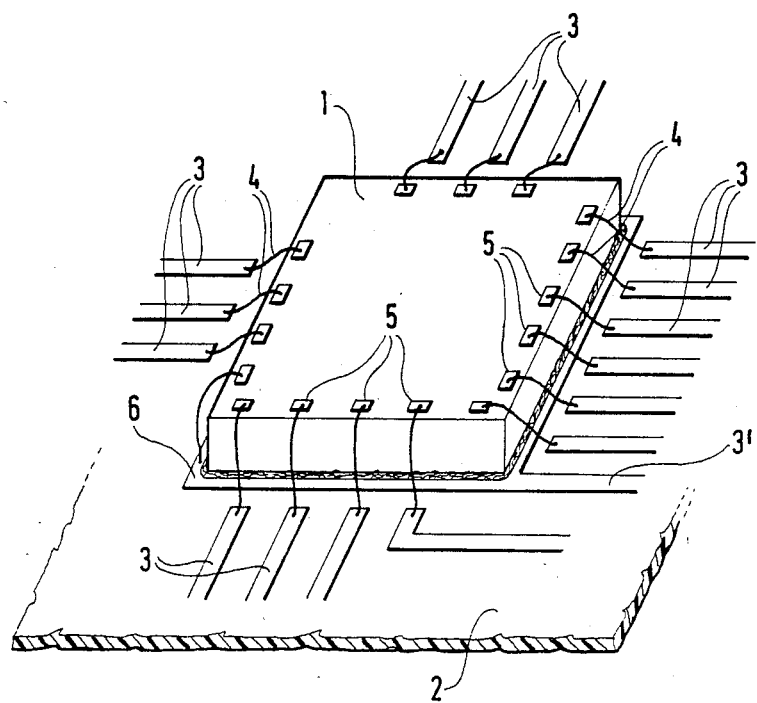
FIG. 1 represents an example of a conventional mounting of an electronic component on a substrate.

In a conventional manner as represented in FIG. 1, an electronic component 1 of the chip type is mounted on a supporting insulating substrate 2 covered in a plurality of conducting tracks 3 which supply electricity to the component 1 by means of connecting wires 4 whose ends are bonded firstly to connecting zones 5 of the component and secondly to the tracks.

Figure 2:
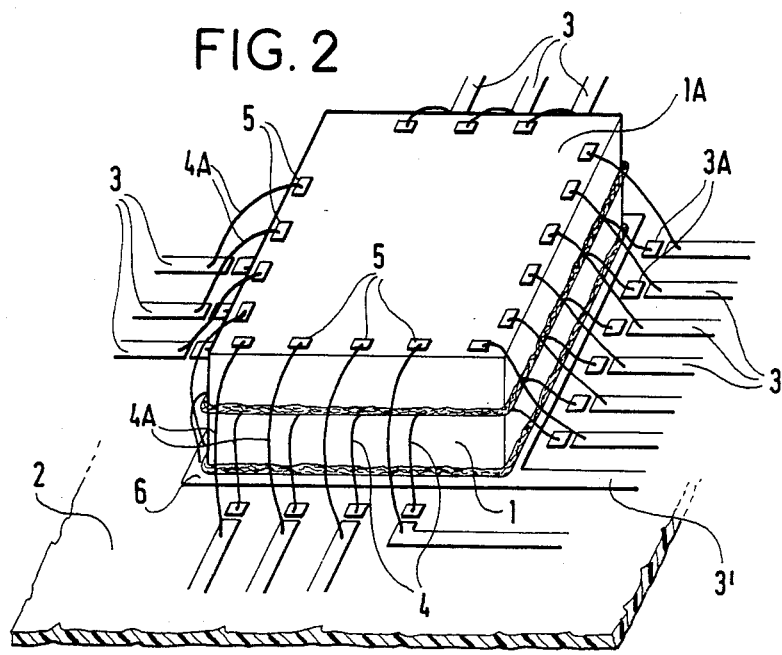
FIG. 2 represents an example of a mounting obtained after using the method in accordance with the present invention.

If it is desired to replace the component 1 by another one and avoid the drawbacks which have been indicated above, the component 1 is left in place, and first of all the conducting tracks 3 to which it is connected are cut in such a manner as to take it out of circuit, as shown in FIG. 2.

Thus the wires 4 connecting the connecting zones 5 of the component 1 remain connected to portions 3a of the tracks 3 which are electrically isolated from these tracks by the effected cuts.

The tracks are easily cut by using a laser whose spot sublimes the metal layer onto which it is projected, especially in the case of a hybrid module using thin films.

Thereafter the component 1 is covered on its upper accessible surface with a glue so that a component 1A intended to replace it functionally can be placed on top thereof. The glueing is effected conventionally by means of an epoxy resin which is placed, using a pad for example, on the central part of the upper surface comprised between the connecting zones 5 of the wires.

The thickness of the deposited layer is of about 40–200 microns which eliminates the problem of placing the replacement component 1A in a projecting or skewed manner, it being understood that the replacement component is oriented in a manner identical with that of the component 1 which is to be taken out of service.

The positioning of the replacement component is effected in a conventional manner identical to that used for the original component.

After positioning, the glue is hardened, in the present example by being brought to its polymerization temperature.

Thereafter the interconnection wires 4A are connected by thermo-compression or by means of ultrasound firstly to the connection zones 5A disposed on the upper accessible surface of the replacement component 1A and, secondly to the tracks 5.

In this manner the problems which would have arisen by cutting the connecting wires 4 are avoided because these wires remain in place, but are not used anymore.

If it is desired to maintain the body of component 1A at a given potential which is achieved by a metallized glue surface 6 beneath the component 1, it is sufficient not to cut the tracks 3' supplying the potential to this surface. If, as is always the case for complex components, the same potential is transferred to the upper surface of the component by a connecting wire and this wire remains supplied with electricity, then desired potential is found on the upper surface. In this case the connection of the replacement component 1A is made by using a conductive resin which thus guarantees the desired electrical continuity.

Figure 3:
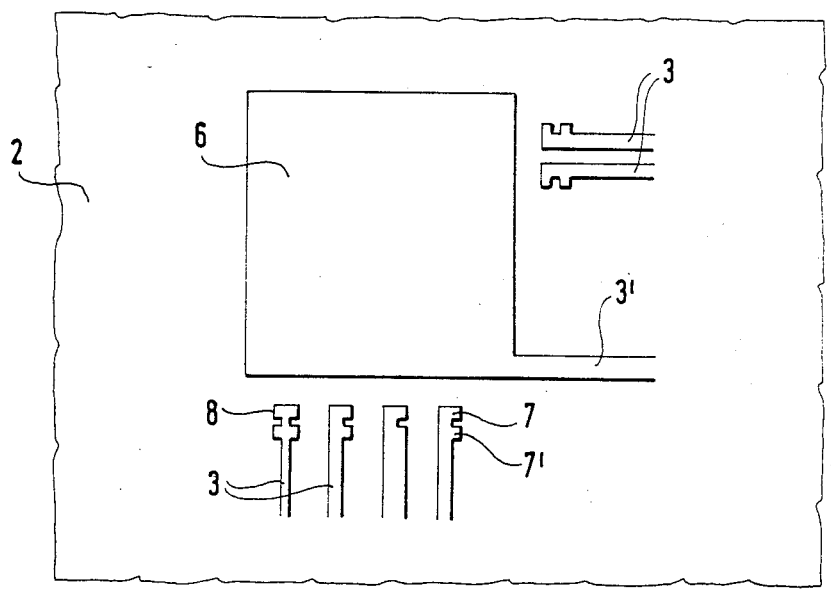
FIG. 3 represents a substrate whose conductive strips have been modified in order to permit performance of the method in accordance with the present invention.

When designing the conducting tracks it is also possible to provide a two-part connecting tab 7, 7' on each track or necked zone 8 for future cutting (FIG. 3).

This method is advantageously applied to integrated circuits and to vacuum deposited thin film resistive circuits because it has the advantage of being easily automated.

The final protection of the repaired circuit is performed by means of the usual technology for the circuit: in the case of hybrid circuits in a hermetic casing there may be no other protection; otherwise protection may be performed by depositing a layer of lacquer of the parylene type; or else by coating.

This method is equally applicable in the integrated circuits industry when the circuit is mounted in a package having connections which can be cut by any method and when the cost of the package justifies its recovery.

Naturally, if the replacement component 1A is defective it is also possible to mount another component by the same principle of the present invention, which component is superposed over the first two.

We claim:

1. A method of replacing an electronic component which is electrically connected to conducting tracks (3) of a supporting substrate by means of connecting wires (4), characterised in that it comprises the following successive steps:

cutting by laser the conducting strips (3) beyond, relative to the component (1) to be taken out of service, the zones where the connecting wires (4) are attached to the tracks;

applying glue on the accessible upper surface of the component (1);

placing a replacement component (1A) on the component to be taken out of service;

causing the glue to set by heating;

interconnecting the replacement component (1A) with the conducting tracks (3).

2. A method of replacing an electronic component according to claim 1, for a component having its lower surface and its upper surface at a certin given potential, characterised in that the supply track (3') for supplying the given potential is kept intact and that the replacement component (1A) is connected to this track (1) via the component (1) using a conducting glue.

* * * * *